United States Patent
Brunner et al.

(10) Patent No.: US 10,117,329 B2
(45) Date of Patent: Oct. 30, 2018

(54) CARRIER PLATE, DEVICE HAVING THE CARRIER PLATE AND METHOD FOR PRODUCING A CARRIER PLATE

(71) Applicant: Snaptrack Inc., San Diego, CA (US)

(72) Inventors: Sebastian Brunner, Graz (AT); Stefan Leopold Hatzl, Graz (AT)

(73) Assignee: QUALCOMM Incorporated, San Diego, CA (US)

( * ) Notice: Subject to any disclaimer, the term of this patent is extended or adjusted under 35 U.S.C. 154(b) by 80 days.

(21) Appl. No.: 14/424,754

(22) PCT Filed: Aug. 9, 2013

(86) PCT No.: PCT/EP2013/066731
§ 371 (c)(1),
(2) Date: Feb. 27, 2015

(87) PCT Pub. No.: WO2014/032940
PCT Pub. Date: Mar. 6, 2014

(65) Prior Publication Data
US 2015/0223329 A1 Aug. 6, 2015

(30) Foreign Application Priority Data
Aug. 27, 2012 (DE) .......... 10 2012 107 876

(51) Int. Cl.
*H05K 1/02* (2006.01)
*H01L 23/498* (2006.01)
(Continued)

(52) U.S. Cl.
CPC ......... *H05K 1/0296* (2013.01); *B23K 1/0016* (2013.01); *B23K 1/20* (2013.01);
(Continued)

(58) Field of Classification Search
USPC .......................... 361/760–774; 174/259–264
See application file for complete search history.

(56) References Cited

U.S. PATENT DOCUMENTS 5,773,764 A * 6/1998 von Vajna .......... G01R 31/2818
174/250
6,577,012 B1   6/2003 Greenwood et al.
(Continued)

FOREIGN PATENT DOCUMENTS

DE   102007044046 A1   4/2009
DE   102009038674 B4   2/2012
(Continued)

OTHER PUBLICATIONS

International Search Report and Written Opinion—PCT/EP2013/066731—ISA/EPO—dated Oct. 30, 2013.

*Primary Examiner* — Tuan T Dinh
(74) *Attorney, Agent, or Firm* — Patterson & Sheridan, L.L.P.

(57) ABSTRACT

A carrier plate includes a substrate and at least one conductor track. The conductor track includes a first layer, which is applied directly on the substrate, and a second layer, which is arranged on the first layer. The second layer includes a supply line region and a soldering region. Furthermore, the second layer is completely interrupted between the supply line region and the soldering region. A device can be produced with a carrier plate and an electrical component arranged on the carrier plate.

15 Claims, 6 Drawing Sheets

(51) Int. Cl.
*H05K 3/22* (2006.01)
*B23K 1/00* (2006.01)
*B23K 1/20* (2006.01)
*B23K 31/02* (2006.01)
*H01L 21/48* (2006.01)
*H01L 23/492* (2006.01)
*H05K 1/18* (2006.01)
*H05K 3/24* (2006.01)
*H01L 23/00* (2006.01)
*H05K 3/34* (2006.01)

(52) U.S. Cl.
CPC ......... *B23K 31/02* (2013.01); *H01L 21/4846* (2013.01); *H01L 23/492* (2013.01); *H01L 23/498* (2013.01); *H01L 23/49838* (2013.01); *H01L 24/81* (2013.01); *H05K 1/18* (2013.01); *H05K 3/22* (2013.01); *H05K 3/34* (2013.01); *H01L 24/16* (2013.01); *H01L 2224/131* (2013.01); *H01L 2224/16238* (2013.01); *H01L 2224/81801* (2013.01); *H01L 2224/81815* (2013.01); *H01L 2924/12042* (2013.01); *H05K 3/244* (2013.01); *H05K 3/3436* (2013.01); *H05K 2201/10674* (2013.01); *H05K 2203/0361* (2013.01); *H05K 2203/04* (2013.01); *H05K 2203/107* (2013.01); *H05K 2203/1173* (2013.01)

(56) References Cited

U.S. PATENT DOCUMENTS

| | | | |
|---|---|---|---|
| 6,638,592 B1* | 10/2003 | Schulz-Harder | H01L 21/481 257/E23.07 |
| 6,712,625 B2 | 3/2004 | Saito et al. | |
| 7,242,099 B2* | 7/2007 | Lin | H01L 21/568 257/734 |
| 7,435,910 B2* | 10/2008 | Sakamoto | H01L 21/4846 174/260 |
| 7,855,461 B2* | 12/2010 | Kuo | H01L 22/32 257/780 |
| 8,304,919 B2* | 11/2012 | Pendse | H01L 23/3171 257/778 |
| 2006/0202322 A1* | 9/2006 | Kariya | H01L 23/49827 257/698 |
| 2008/0206928 A1 | 8/2008 | Onishi et al. | |
| 2008/0237814 A1 | 10/2008 | Bayan | |
| 2009/0236756 A1 | 9/2009 | Kim et al. | |
| 2012/0218728 A1 | 8/2012 | Brunner et al. | |

FOREIGN PATENT DOCUMENTS

| | | |
|---|---|---|
| JP | 200686201 A | 3/2006 |
| JP | 2007158364 A | 6/2007 |
| JP | 2008227055 A | 9/2008 |
| JP | 2009147210 A | 7/2009 |

\* cited by examiner

CARRIER PLATE, DEVICE HAVING THE CARRIER PLATE AND METHOD FOR PRODUCING A CARRIER PLATE

This patent application is a national phase filing under section 371 of PCT/EP2013/066731, filed Aug. 9, 2013, which claims the priority of German patent application 10 2012 107 876.9, filed Aug. 27, 2012, each of which is incorporated herein by reference in its entirety.

TECHNICAL FIELD

A carrier plate is specified. A device comprising a carrier plate and an electrical component arranged on the carrier plate and a method for producing a carrier plate are furthermore specified.

BACKGROUND

When semiconductor chips having a multiplicity of contacts, so-called inputs and outputs ("IOs"), are linked to a substrate, a so-called "fan-out" or "fan-in" is required in order to link all inputs and outputs, respectively, since plated-through holes, so-called vias, in substrates cannot be realized with anything like the same density as the inputs and outputs on a semiconductor chip. In the case of "fan-out" or "fan-in", conductor track traces are in this case spread apart or drawn together, which is also designated as "redistribution wiring".

Each "fan-in" or "fan-out" usually requires a so-called solder stop, since solder during reflow soldering would otherwise flow away over the conductor track in an undefined manner. In the case of flip-chip bonding, this would lead to what is referred to in the jargon as collapsing of the solder bumps. By way of example, a layer composed of a poorly wettable polymer over which the solder does not flow away is used as a solder stop. The polymer layer has to be photopatterned on account of the required accuracy. Usually, with the use of a solder stop, both so-called SMD arrangements (SMD: "solder mask defined") and so-called NSMD arrangements ("non-solder mask defined") are used, wherein soldering regions are predefined by a solder mask in the case of an SMD arrangement, whereas the soldering regions are determined by the conductor track traces themselves in the case of the NSMD arrangement.

SUMMARY

One problem addressed by at least some embodiments is that of specifying a carrier plate which has improved properties in comparison with known carrier plates and in addition can be produced cost-effectively. Further problems addressed by at least some embodiments involve specifying a device having a carrier plate and an electrical component arranged on the carrier plate and a method for producing a carrier plate.

A carrier plate in accordance with at least one embodiment has a substrate and at least one conductor track. The substrate preferably comprises an organic material or a ceramic material. By way of example, the substrate can be a printed circuit board, such as an FR4 printed circuit board, for example. Furthermore, it is possible for the substrate to comprise or consist of an LTCC ceramic, an HTCC ceramic, or an MLV ceramic. In this case, LTCC stands for "low temperature cofired ceramics", that is to say for ceramics which are typically sintered at temperatures of below 1000° C., HTCC stands for "high temperature cofired ceramics", that is to say for ceramics that are typically sintered at temperatures of above 1000° C., and MLV stands for "multilayer varistor". The at least one conductor track is applied on a surface of the substrate.

In accordance with a further embodiment, the conductor track comprises a first layer, which is applied directly on the substrate. Here and hereinafter, the first layer can also be designated as "base metallization" or as "base metallization layer". By way of example, the first layer can comprise copper or silver or a combination thereof or can consist of one of these materials. The conductor track furthermore has a second layer, which is arranged on the first layer. The second layer is preferably the topmost layer of the conductor track at the furthest distance from the substrate of the carrier plate. Here and hereinafter, the second layer can also be designated as "final metallization", as "final metallization layer" or as "metallization finish".

By way of example, the second layer can be applied directly on the first layer. Furthermore, it is possible for one or a plurality of further layers to be arranged between the first and second layers. Preferably, the second layer comprises a different material than the first layer. The second layer can, for example, comprise gold or consist of gold. By way of example, this can involve so-called "Flashgold", that is to say a thin, for example, maximally 120 nm thick, gold surface which is generally applied rapidly and which is used for soldering, in particular, such as, for example, so-called "direct immersion gold" (DIG).

In accordance with a further embodiment, the second layer has a supply line region and a soldering region, wherein the second layer is completely interrupted between the supply line region and the soldering region. That can mean, in particular, that no second layer is present in the interrupted region arranged between the supply line region and the soldering region. Preferably, the second layer is removed in the interrupted region. The soldering region can be provided in particular for applying a solder, for example, in the form of a solder bump, by means of which a contact of a semiconductor chip, for example, can be contacted, while the supply line region can form a so-called "Fan-In" or "Fan-Out" or at least one part thereof.

Preferably, the first layer is continuous below the interrupted region. By way of example, the second layer can be removed in the interrupted region, wherein the first layer situated underneath has no interruption whatsoever in this region.

In the case of a carrier plate described here, the wettability of the conductor track can advantageously be reduced by means of the interrupted region of the second layer in this region of the conductor track, such that the interrupted region acts as a solder stop. By way of example, in the case of a metallization comprising the layer sequences Ni/Pd/Au or Ni/Au, precisely the gold or flashgold contained in the topmost layer, that is to say in the second layer, is responsible for a high wettability. By removing a region at least of the second layer, that is to say of the topmost layer, containing gold, for example, in the interrupted region, it is thus possible to reduce the high wettability of the conductor track, which can lead to collapsing of the solder bump as described above.

As a result, a carrier plate described here can be produced cost-effectively since expensive solder stop which has to fulfill various requirements can be dispensed with. By way of example, such a solder stop would have to have sufficient adhesive strength both on the substrate and on the metallization. Furthermore, the solder stop would have to be thin enough that flip-chips can be underfilled, and should additionally withstand possible electroplating baths.

Furthermore, in the case of the carrier plate described here it is possible to dispense with additional, cost-intensive photo-processes in which there is a very narrow process window during exposure in particular on account of differing reflection of substrate and metallization.

In accordance with a further embodiment, a part of the second layer is removed in the interrupted region by means of a laser. By way of example, a $CO_2$ laser or a UV laser can be used for the removal. Advantageously, an absorption in the different materials or in the different layers can be controlled very selectively in the case of the laser used, by virtue of the choice of wavelength. As a result, very purposefully selected layers can be removed without underlying layers and/or the substrate being loaded.

In accordance with a further embodiment, at least one partial region of the first layer is oxidized below the interrupted region. This can be achieved, for example, by lasering through as far as the first layer, that is to say as far as the base metallization, and that is to say that the first layer is at least superficially influenced, but not severed, by the laser used to produce the interruption of the second layer. The action of the laser can result in the formation of an oxidation at least in a partial region of the surface of the first layer. The oxidized partial region of the e.g. copper-containing base metallization can afford the advantage that it additionally acts as a solder stop, since solder can poorly wet the oxidized partial region. Furthermore, it is possible for the first layer to be chemically oxidized or chemically treated in some other way, such that the first layer becomes poorly wetting.

In accordance with a further embodiment, the conductor track has a third layer, which is arranged between the first and second layers. The third layer preferably directly adjoins the first layer of the conductor track. Furthermore, the third layer can directly adjoin the second layer of the conductor track. Furthermore, it is also possible, however, for one or a plurality of further layers to be arranged between the third and second layers. The third layer comprises nickel or consists of nickel, for example. Advantageously, nickel can act as a diffusion barrier and prevent the base metallization from being decomposed by a solder such as, for example, a lead-free tin, silver or copper solder (so-called "bleaching" or "dealloying").

In accordance with a further embodiment, the third layer is continuous below the interrupted region. By way of example, by means of choosing the suitable wavelength of the laser, in a targeted manner, it is possible to remove a part of the second layer in the interrupted region, but without also removing the third layer situated below the second layer.

In accordance with a further embodiment, the third layer is interrupted below the interrupted region. Consequently, it is possible, for example, by means of the laser, in a targeted manner, to remove a part of the second layer in the interrupted region and also to remove a part of the third layer below the interrupted region, wherein the first layer situated underneath, for example, is not damaged or alternatively is oxidized, as described above.

In accordance with a further embodiment, the conductor track has a fourth layer, which is arranged between the second and third layers. Preferably, in this case, the fourth layer adjoins both the second and the third layer of the conductor track. The fourth layer can comprise palladium or consist of palladium, for example. Preferably, the fourth layer is interrupted below the interrupted region of the second layer. By way of example, it is possible to remove the second layer in the interrupted region and the fourth layer below the interrupted region by means of a laser, wherein the third layer can be continuous or likewise interrupted below the interrupted region. In an alternative embodiment, the fourth layer is continuous below the interrupted region, wherein the third layer situated underneath is likewise continuous. This configuration can be achieved, for example, by only the second layer being removed in the interrupted region.

In accordance with a further embodiment, a layer of the conductor track which is exposed by one or a plurality of interrupted layers has a lower wettability than the layer arranged directly thereabove. By way of example, those layers in and/or below the interrupted region which have a high wettability can be removed in a very targeted manner by means of a laser. As a result, an efficient solder stop can be obtained even without the use of an expensive solder stop.

In accordance with a further embodiment, the soldering region is at least partially covered by a solder. By way of example, at least one part of the soldering region can be covered by a solder bump arranged on the soldering region. By means of the interrupted region of one or more layers of the conductor track, it is possible to prevent the solder applied to the soldering region from flowing away.

In accordance with a further embodiment, the conductor track has a further soldering region at an end of the supply line region opposite to the soldering region. Preferably, the supply line region is once again separated from the further soldering region by means of an interrupted region. The further soldering region in this case is preferably likewise at least partially covered by a solder.

In accordance with a further embodiment, the carrier plate is free of solder stop. Advantageously, as explained above, in the case of a carrier plate described here the application of solder stop can be dispensed with, as a result of which the costs arising during the production of the carrier plate can be reduced.

In accordance with at least one further embodiment, a device comprises a carrier plate and an electrical component arranged on the carrier plate. The electrical component can be in particular a semiconductor component, for example, a semiconductor chip in the form of a surface-mountable component or a flip-chip. Furthermore, the electrical component can be a component which is fixed on a carrier by means of a so-called "Under-Bump-Metallization" (UBM), which is connected directly to one or a plurality of conductor tracks, for example.

The device can comprise a carrier plate having one or more features of the abovementioned embodiments and of the further embodiments.

In accordance with one embodiment, the carrier plate comprises a substrate and a plurality of conductor tracks. Preferably, the conductor tracks are in each case applied on the substrate. Preferably, the conductor tracks have in each case a first layer, which are applied directly on the substrate, and in each case a second layer arranged on the first layer. In particular, each of the conductor tracks can be embodied in accordance with the above-described embodiments for the at least one conductor track.

In accordance with a further embodiment, the second layers of the plurality of the conductor tracks have in particular in each case a supply line region and a soldering region, wherein the second layers are in each case completely interrupted between the supply line region and soldering region.

In accordance with a further embodiment, the soldering regions of the plurality of the conductor tracks define an area forming a connection region for the electrical component. By way of example, a plurality of soldering regions can define an area of an arbitrary shape, such as, for example, a square or a rectangle, wherein the electrical component can be arranged and fixed on said area.

In accordance with a further embodiment, the electrical component is connected to the soldering regions by means of solder. As a result, the electrical component can both be mechanically fixed on the carrier plate and be electrically connected to conductor tracks on the carrier plate. Preferably, the supply line regions are free of solder outside the connection region.

In accordance with at least one further embodiment, in a method, a carrier plate is produced. The carrier plate can have one or more features of the embodiments mentioned above. In particular, the embodiments described above and the embodiments described below apply equally to the carrier plate and to the method for producing the carrier plate.

In accordance with a further embodiment, a carrier plate is provided, which comprises a substrate and at least one conductor track. The conductor track preferably has a first layer, which is applied directly on the substrate, and a second layer, which is arranged on the first layer.

In a further method step, a region of the second layer is removed, such that the second layer is completely interrupted between the supply line region and the soldering region. Furthermore, it is possible to remove a third and/or a fourth layer arranged between the first and second layers in the interrupted region.

In accordance with a further embodiment, the removing is carried out by means of laser ablation. Preferably, a laser having a suitable power and wavelength is used in this case, as already described above. By way of example, a $CO_2$ laser or a UV laser can be used in this case.

By means of the laser, advantageously, selected layers can be removed in a highly targeted manner, without loading underlying layers and/or the substrate. Furthermore, the method described here has the advantage that a redistribution wiring can be made directly on the substrate, without being buried into inner layers in the substrate, that is to say that a soldering location can be connected to the conductor trace on the surface of the substrate. As a result, it is possible to save space within the carrier plate and to increase the integration density.

Preferably, the method described here can be used in particular in the case of carrier plates which require a surface with conductor tracks structured with high resolution.

BRIEF DESCRIPTION OF THE DRAWINGS

Further advantages and advantageous embodiments of the carrier plate and of the device comprising the carrier plate will become apparent from the embodiments described below in association with FIGS. 1 to 6.

In the figures.

In the exemplary embodiments and figures, identical or identically acting constituent parts may in each case be provided with the same reference signs. The illustrated elements and their size relationships among one another should not be regarded as true to scale, in principle. Rather individual elements such as, for example, layers, component parts and regions may be illustrated with exaggerated thickness or size dimensions in order to enable better illustration and/or in order to afford a better understand.

DETAILED DESCRIPTION OF ILLUSTRATIVE EMBODIMENTS

Figure 1:
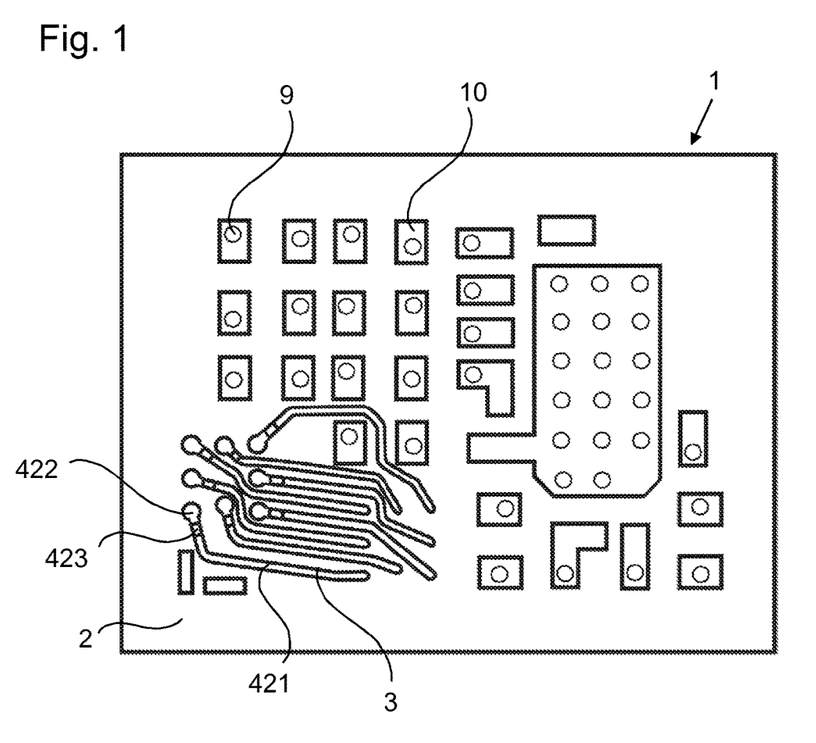
FIG. 1 shows a schematic plan view of a carrier plate in accordance with one exemplary embodiment.

FIG. 1 illustrates a carrier plate 1 in accordance with one exemplary embodiment. The carrier plate 1 comprises a substrate 2 composed of an LTCC ceramic and a plurality of conductor tracks 3, which are arranged on the substrate 2. Alternatively, the substrate 2 can also be an HTCC or MLV ceramic or a printed circuit board, for example, an FR4 printed circuit board. The individual conductor tracks 3 in each case have a soldering region 422, an interrupted region 423 and a supply line region 421, as described in association with the following exemplary embodiments. Furthermore, the carrier plate 1 comprises a plurality of metallizations 10 and vias 9, which can serve for connecting electrical components.

The soldering regions 422 of the conductor tracks form an area forming a connection region for an electrical component, while the supply line regions form redistribution wirings. The number, the shape, the arrangement, and the course of the conductor tracks 3 and of the further components of the carrier plate 1 shown should be understood to be purely by way of example and not restrictive.

Figure 2:
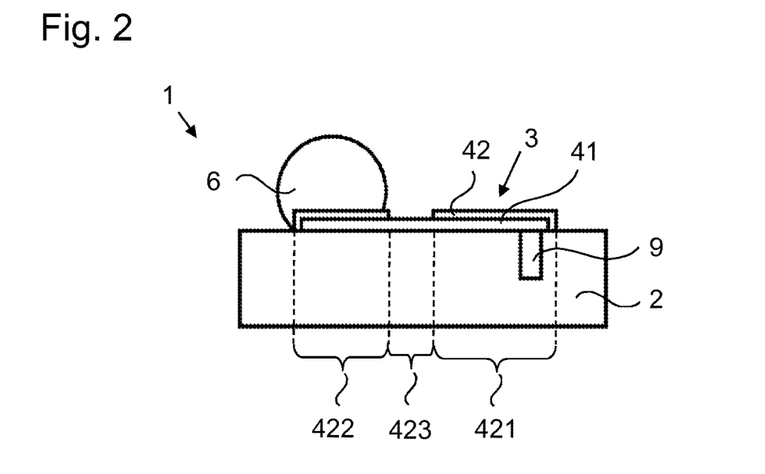
FIG. 2 shows a schematic cross section of a carrier plate with a conductor track in accordance with a further exemplary embodiment.

FIG. 2 shows a carrier plate 1 in accordance with a further exemplary embodiment, which can be, for example, a cross section of a partial region of the carrier plate 1 from FIG. 1 along one of the conductor tracks 3 shown therein. The conductor tracks 3 arranged on the substrate 2 has a first layer 41, which is applied directly on the substrate 2. In the exemplary embodiment shown, the first layer 41 contains copper. Alternatively, the first layer 41 can also contain silver. By way of example, the first layer can have a layer thickness of between 15 μm and 20 μm. Furthermore, the conductor track 3 has a second layer 42, containing gold, which is arranged on the first layer 41 and forms the topmost layer of the conductor track 3. The second layer 42, containing gold, can be, for example, a layer composed of so-called "direct immersion gold" (DIG). The second layer 42 can have, for example, a layer thickness of approximately 50 nm.

Figure 9:
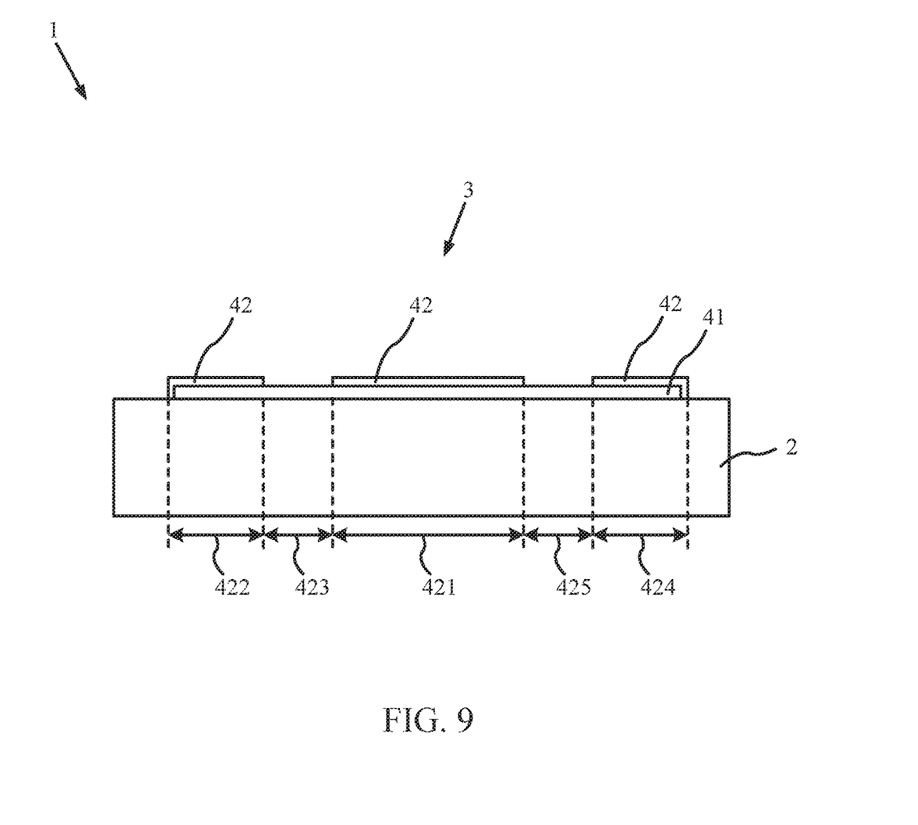
FIG. 9 shows a schematic cross-section of a carrier plate with a conductor track in accordance with a further exemplary embodiment.

The second layer 42 has a supply line region 421 and a soldering region 422, wherein the second layer 42 is interrupted between the supply line region 421 and the soldering region 422 in an interrupted region 423. The first layer 41 of the conductor track 3 is continuous below the interrupted region 423. A solder 6 in the form of a solder ball which serves for making contact with an electrical component is arranged on the soldering region 422. Furthermore, the carrier plate 1 comprises a via 9, which is filled with an electrically conductive material and is electrically conductively connected to the conductor track 3. As shown in FIG. 9, an alternative to a via, a further soldering region 424 can be adjacent to an end of the supply line region 421 opposite to the soldering region 422, wherein preferably there is once again an interrupted region 425 present between the supply line region 421 and the further soldering region 424.

Figure 7:
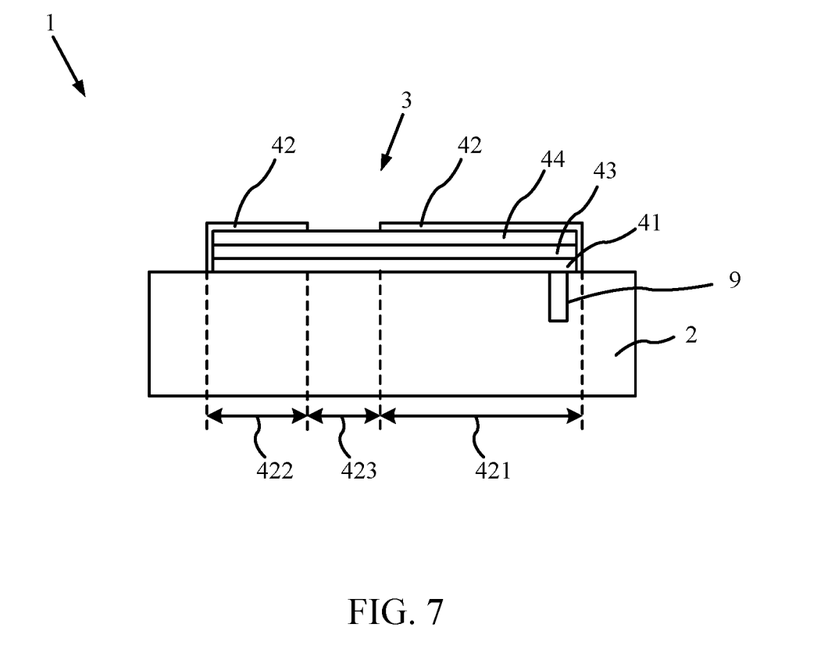
FIG. 7 shows a schematic cross-section of a carrier plate with a conductor track in accordance with a further exemplary embodiment.

Furthermore, the conductor track 3 can also have a third layer 43, which is arranged between the first and the second layers 41, 42, and optionally also a fourth layer 44, which is arranged between the second and third layers 42, 43. The metallization applied on the first layer 41, that is to say on the base metallization, and composed of third and second layers 43, 42 or composed of third, fourth and second layers 43, 44, 42 can be, for example, Ni/Au (electroless nickel/immersion gold, ENIG) or electroless Ni/Pd/Au (electroless nickel/electroless palladium/immersion gold, ENEPIG). The third layer 43 can have, for example, a layer thickness of between 2 µm and 4 µm and the fourth layer 44 can have, for example, a layer thickness of 0.3 µm and 0.5 µm. As noted above, in an embodiment, by only removing the second layer 42 in the interrupted region 423, the fourth layer 44 is continuous below the interrupted region 423 and the third layer 43 situated underneath is likewise continuous. FIG. 7 shows the fourth layer 44 and the third layer 43 continuous below the interrupted region 423.

Figure 3:
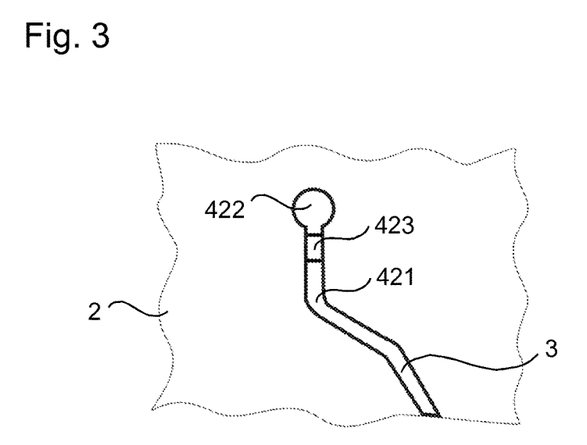
FIG. 3 shows an excerpt from a schematic plan view of a conductor track of a carrier plate in accordance with a further exemplary embodiment.

FIG. 3 shows an excerpt from a conductor track 3 on a substrate 2 in accordance with a further exemplary embodiment, which can be, for example, a conductor track 3 of the carrier plate 1 from FIG. 1. The conductor track 3 has an interrupted region 423, which is arranged between a soldering region 422 and a supply line region 421.

In the case of the carrier plate 1 shown here, advantageously, by means of the interrupted region 423 of the second layer 42, that is to say of the layer that contains gold and is responsible for high wettability, it is possible to reduce the wettability in this region of the conductor track 3, such that the interrupted region 423 acts as a solder stop. As a result, the carrier plate described here can be produced cost-effectively since expensive solder stop can be dispensed with.

Figure 4:
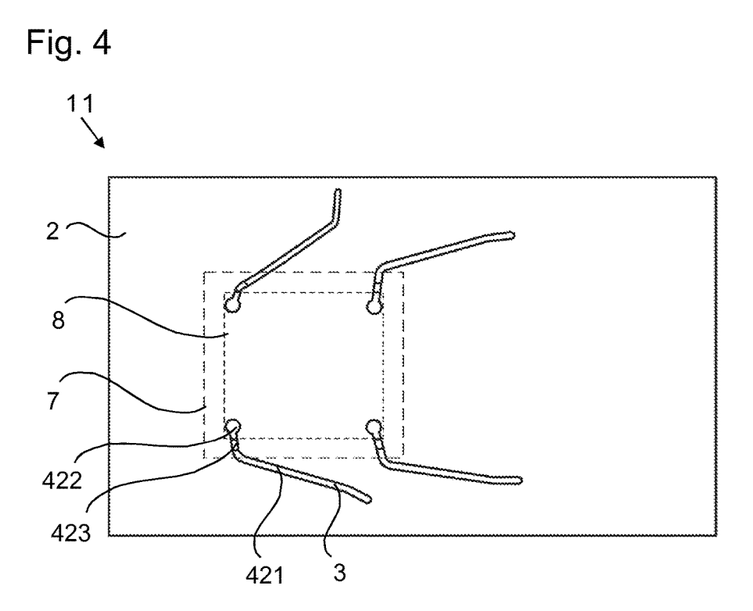
FIG. 4 shows a plan view of a device with a carrier plate and an electrical component arranged thereon in accordance with a further exemplary embodiment.

FIG. 4 shows a plan view of a device 11 comprising a carrier plate 1 and an electrical component 7 arranged on the carrier plate 1. The electrical component 7 is merely indicated, in order to be able to illustrate the structures situated underneath.

The carrier plate 1 comprises a substrate 2 and a plurality of conductor tracks 3, which are in each case applied on the substrate 2. The conductor tracks 3 in each case have a first layer 41 which is applied directly on the substrate 2, and a second layer 42, which is arranged on the first layer 41. In this case, the second layers 42 in each case have a supply line region 421 and a soldering region 422. The second layers 42 are completely interrupted by an interrupted region 423 between the supply line region 421 and soldering region 422. The soldering regions 422 define an area forming a connection region 8 for the electrical component 7. The electrical component 7 is connected to the soldering regions 422 by means of solder 6, as a result of which the electrical component is fixed on the carrier plate 1. By way of example, the electrical component 7 can have one or a plurality of contact areas by means of which the electrical component 7 is electrically conductively connected to the soldering regions 422 by the solder 6. The supply line regions 421 outside the connection region 8 are free of solder 6 and form a redistribution wiring. By means of the interrupted regions 423 of the first layers 41 of the conductor tracks 3, it is possible to produce a solder stop for the solder 6 applied to the soldering regions 422. The electrical component 7 can be, for example, a semiconductor component, such as, for example, a semiconductor chip in the form of a surface-mountable component or a flip-chip.

Figure 5:
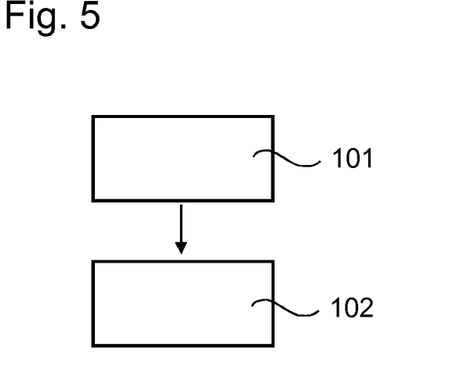
FIGS. 5 and 6 show schematic illustrations of methods for producing a carrier plate in accordance with further exemplary embodiments.

FIG. 5 shows a schematic view of a method for producing a carrier plate 1 as shown, for example, in the previous exemplary embodiments. In this case, a first method step 101 involves providing a carrier plate 1 comprising a substrate 2 and at least one conductor track 3 applied on the substrate 2. The conductor track 3 has a first layer 41, which is applied directly on the substrate, and a second layer 42, which is arranged on the first layer 41 and forms a topmost layer of the conductor track 3. A further method step 102 involves removing a region of the second layer 42, such that the second layer 42 is completely interrupted between the supply line region 421 and the soldering region 422. Preferably, the region of the second layer 42 is removed by means of laser ablation. Furthermore, it is possible also to remove regions of further layers 43, 44 below the interrupted region 423 of the second layer 42 by means of a laser. Moreover, the method can involve lasering to the first layer 41, such that at least one partial region thereof oxidizes and likewise acts as a solder stop on account of resulting poor wetting properties.

Figure 6:
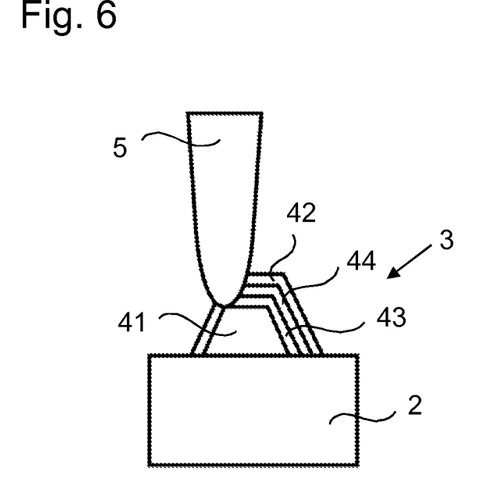
Figure 8:
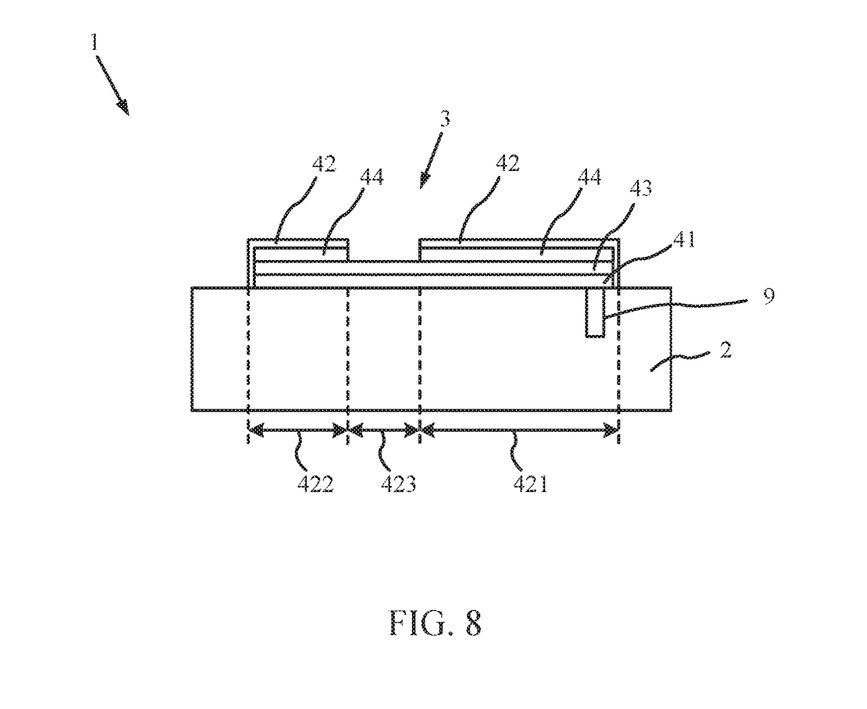
FIG. 8 shows a schematic cross-section of a carrier plate with a conductor track in accordance with a further exemplary embodiment.

FIG. 6 shows a schematic illustration of the method step 102, in which regions of a second layer 42, of a third layer 43 and of a fourth layer 44 are removed by means of a laser beam 5. Alternatively, it is also possible to remove only a region 423 of the second layer 42, or only a region 423 of the second layer 42 and an underlying region of the fourth layer 44. For example, as shown in FIG. 8 only a region 423 of the second layer 42 and an underlying region of the fourth layer 44 has been removed.

In experiments carried out it was possible to show that by means of laser ablation in a highly selective manner it is possible to remove one or a plurality of layers responsible for solder wetting in the interrupted region 423.

The features described in the exemplary embodiments shown can also be combined with one another in accordance with further exemplary embodiments, even if such combinations are not explicitly shown in the figures. Alternatively or additionally, the exemplary embodiments shown in the figures can have further features in accordance with the embodiments of the general description.

The invention is not restricted to the exemplary embodiments by the description on the basis of said exemplary embodiments, but rather encompasses any novel feature and also any combination of features. This includes in particular any combination of features in the patent claims, even if this feature or this combination itself is not explicitly specified in the patent claims or exemplary embodiments.

The invention claimed is:

1. A carrier plate comprising:
   a substrate; and
   a conductor track,
   wherein the conductor track comprises a first layer arranged directly on the substrate,
   wherein the conductor track further comprises a second layer arranged on the first layer,
   wherein the second layer comprises gold,
   wherein the second layer comprises a supply line region and a first soldering region at one end of the supply line region, the first soldering region defining an area forming a connection region for an electrical component,
wherein the second layer further comprises a second soldering region adjacent to another end of the supply line region opposite to the first soldering region,
wherein the second layer includes a first interrupted region so that the second layer is completely interrupted between the supply line region and the first soldering region,
wherein the second layer includes a second interrupted region between the supply line region and the second soldering region,
wherein the conductor track further comprises a third layer including nickel arranged between the first and second layers, and
wherein the conductor track further comprises a fourth layer arranged between the second and third layers.

2. The carrier plate according to claim 1, wherein the first layer is continuous below the first interrupted region.

3. The carrier plate according to claim 1, wherein the third layer is continuous below the first interrupted region.

4. The carrier plate according to claim 1, wherein the third layer is interrupted below the first interrupted region.

5. The carrier plate according to claim 1, wherein a layer of the conductor track that is exposed by the first interrupted region has a lower wettability than the second layer.

6. The carrier plate according to claim 1, wherein the first soldering region is at least partially covered by a solder.

7. The carrier plate according to claim 1, wherein the carrier plate is free of solder stop.

8. The carrier plate according to claim 3, wherein the fourth layer is interrupted below the first interrupted region.

9. The carrier plate according to claim 3, wherein the fourth layer is continuous below the first interrupted region.

10. The carrier plate according to claim 4, wherein the fourth layer is interrupted below the first interrupted region.

11. A device comprising:
a carrier plate; and
an electrical component arranged on the carrier plate,
wherein the carrier plate comprises a substrate and a plurality of conductor tracks, each conductor track disposed on the substrate,
wherein each conductor track comprises a first layer disposed directly on the substrate,
wherein each conductor track further comprises a second layer disposed over the first layer,
wherein each second layer comprises gold,
wherein each second layer comprises a supply line region and a first soldering region at one end of the supply line region,
wherein each second layer further comprises a second soldering region adjacent to another end of the supply line region opposite to the first soldering region,
wherein each second layer is completely interrupted between the supply line region and the first soldering region,
wherein the second layer is further interrupted between the supply line region and the second soldering region,
wherein each conductor track further comprises a third layer including nickel arranged between the first and second layers of the conductor track,
wherein each conductor track further comprises a fourth layer arranged between the second and third layers of the conductor track,
wherein the soldering regions define an area that forms a connection region for the electrical component,
wherein the electrical component is soldered to the first soldering regions, and
wherein the supply line region is free of solder.

12. A method for producing a carrier plate, comprising:
arranging the carrier plate comprising a substrate and a conductor track, the conductor track comprising a supply line region, a first soldering region at one end of the supply line region, and a second soldering region adjacent to another end of the supply line region opposite to the first soldering region, wherein the conductor track comprises a first layer disposed directly on the substrate and a second layer including gold, disposed over the first layer, wherein the conductor track further comprises a third layer including nickel arranged between the first and second layers, and wherein the conductor track further comprises a fourth layer arranged between the second and third layers;
removing a first region of the second layer, such that the second layer is completely interrupted between the supply line region and the first soldering region;
removing a second region of the second layer, such that the second layer is interrupted between the supply line region and the second soldering region; and
arranging a solder ball on the first soldering region, the solder ball serving for making contact with an electrical component that is arranged on the first soldering region after arranging the solder ball.

13. The method according to claim 12, wherein the removing comprises performing a laser ablation.

14. The method according to claim 12, further comprising soldering the electrical component to the carrier plate using the solder ball arranged on the soldering region, wherein the first soldering region defines an area that forms a connection region for the electrical component.

15. The method according to claim 14, wherein a portion of the first layer of the conductor track that is exposed has a lower wettability than the second layer.

* * * * *